United States Patent [19]

Schmit et al.

[11] 4,270,973

[45] Jun. 2, 1981

[54] GROWTH OF THALLIUM-DOPED SILICON FROM A TIN-THALLIUM SOLUTION

[75] Inventors: Joseph L. Schmit, Hopkins; M. Walter Scott, Minnetonka, both of Minn.

[73] Assignee: Honeywell Inc., Minneapolis, Minn.

[21] Appl. No.: 144,738

[22] Filed: Apr. 28, 1980

Related U.S. Application Data

[63] Continuation of Ser. No. 900,447, Apr. 27, 1978, abandoned.

[51] Int. Cl.$^3$ .............................................. C30B 19/02
[52] U.S. Cl. ...................................... 156/605; 156/64
[58] Field of Search ....... 156/600, 605, 624, DIG. 64; 148/171, 172, 185

[56] References Cited

U.S. PATENT DOCUMENTS

| | | | |
|---|---|---|---|
| 2,759,895 | 8/1956 | Belmont | 156/605 |
| 2,904,512 | 9/1959 | Horn | 156/605 |
| 2,990,372 | 6/1961 | Pinter et al. | 156/605 |
| 3,010,857 | 11/1961 | Nelson | 148/185 |

*Primary Examiner*—Hiram Bernstein
*Attorney, Agent, or Firm*—Omund R. Dahle

[57] ABSTRACT

A method of growing single crystals of silicon doped with thallium for use as an extrinsic silicon photodetector of 3–5 um infrared radiation which will operate above 77 K.

5 Claims, No Drawings

GROWTH OF THALLIUM-DOPED SILICON FROM A TIN-THALLIUM SOLUTION

This is a continuation of application Ser. No. 900,447, filed Apr. 27, 1978, now abandoned.

BACKGROUND AND SUMMARY OF THE INVENTION

This invention is related to the arts of growing photoconductive semiconductors from metallic solutions. Particularly, this invention provides a method of growing single crystals of silicon doped with a concentration of thallium, which thallium concentration is sufficiently high to give a high absorption coefficient. Thallium has a sufficiently large ionization energy to make extrinsic silicon detectors of 3-5 um infrared radiation which operate above 77K.

The growth of semiconductors from metallic solutions is well known. It is the basis for liquid phase epitaxy (LPE) processes, for example growth of gallium arsenide (GaAs) from gallium (Ga) solution. Thick layers can be grown by the solution growth (SG) process; for example, silicon (Si) can be grown from indium (In) solution. Both processes depend on the concentration of solute being different at different temperatures. In the LPE process a saturated solution is cooled, causing the solute in excess of the solubility limit at the lower temperature to precipitate out as an epitaxial layer. In the SG process, a temperature gradient is imposed across a molten solvent (e.g. In) such that more solute (e.g. Si) is soluble at one end than at the other. A source of solute is placed at the hotter end and a seed at the cooler end. The greater solubility at the hotter end will cause a concentration gradient to develop and the solute will diffuse down the concentration gradient to the cooler end where it will precipitate on the seed. The material grown will contain the solubility limit of solvent at the temperature at which the seed is maintained. In the example of Si grown from In solution, the Si grown will contain the solubility limit of In at the growth temperature. The present dopant used in Si for 3-5 um response is In. Indium has too small an ionization energy however, and therefore requires operation at <60K. Thallium has a larger ionization energy in silicon than has indium, and has the advantage of a higher operating temperature.

The silicon-thallium system presents a unique problem. The solubility of silicon in thallium is infinitesimal even up to 1400° C. so that silicon cannot be grown from thallium solution. However, silicon is soluble in tin (Sn) and can be grown from its solution. Tin is not electrically active in silicon; therefore, by adding tin to thallium we can grow silicon doped to the solubility limit of both tin and thallium. The inactive tin can be ignored while the thallium is a deep acceptor suitable for 3-5 um infrared detection. The novel feature is the addition of a second metal, tin, to the melt thallium, for single crystal solution growth. The unique feature of the tin is that it is not electrically active in silicon but dissolves enough silicon so that silicon can be grown from it.

DESCRIPTION

The increased emphasis on the development of a more sophisticated generation of infrared systems having a high density of detectors and signal processors on the same focal plane has led to a renewed interest in the deeper dopants in silicon. To avoid excessive cooling of the system one would like the detector well matched to the 3-5 um spectral interval. Studies made from a systems viewpoint indicate that the ideal dopant should have an activation energy in the range 0.21-0.29 eV, and be capable of achieving background limited IR performance (BLIP) operation at temperatures above 80K.

Prior to this invention, the detector material which has been successfully integrated in a monolithic structure has been indium-doped silicon. A major problem with indium-doped silicon is the longer-than-desired cut-off wavelength of photoconductors which then requires cooling to about 50K for BLIP operation.

Other dopants for silicon have been investigated to determine if a likely candidate could be found, without much success. Certain dopants which have been tried are sulfur and selenium. These show the presence of multiple levels and do not limit the long wavelength response sufficiently to make a significant difference. In addition, both of these impurities are relatively fast diffusers in silicon, complicating the focal plane fabrication process if contamination by the deeper impurity is to be avoided. An impurity having desirable characteristics for the infrared application is thallium. Its ionization energy of approximately 0.246 eV is of the range providing operation in the 3-5 um range at a much higher temperature than indium-doped photoconductors. As mentioned above, a special problem exists in the use of thallium as a dopant in the growing of thallium-doped silicon crystals for monolithic focal plane arrays.

We are using a novel solution growth process to produce thallium-doped silicon crystals doped to the solubility limit with thallium. The technique uses a single crystal silicon seed, a liquid metal solvent consisting of a mixture of tin and thallium and a silicon source crystal all in a quartz ampoule. During growth, a temperature gradient is superimposed on the ampoule with the source hotter than the substrate. Typically, the temperature $T_H$ at the source is about 50° C. higher than the temperature $T_L$ at the substrate (seed crystal). The amount of silicon soluble in the tin-thallium solution is greater at the higher temperature so a concentration gradient of silicon is set up in the melt corresponding to the temperature gradient. The concentration gradient causes diffusion of the dissolved silicon to the seed crystal where it grows epitaxially. The grown silicon will contain the solubility limit of tin and thallium at the growth temperature. Tin is electrically inactive in silicon so no harm is done to the electrical resistance of the silicon by its presence. The tin is used as the transport medium during growth since the solubility of silicon in pure thallium is so low that growth from a thallium solution would be infinitesimally slow.

One of the thallium-doped silicon crystals grown by this process was grown in 14 days at 1150° C. at a rate of approximately 0.2 mm per day. The crystal is ~1 cm in diameter and ~3 mm thick. It is a single crystal and there is no evidence of a second phase in the single crystal, although there are a few tin-thallium inclusions near the edge of the crystal. It contains a Tl concentration of ~$3 \times 10^{15}$ cm$^{-3}$.

Another Tl doped silicon crystal was grown by this process in four days at 1330° C. at the rate of 1 mm per day. It contains a Tl concentration of ~$5 \times 10^{16}$ cm$^{-3}$.

These crystals are mentioned by way of example and do not imply that these are the conditions to give maximum solubility. This invention can obviously also be used to grow large-area, thin layers of Si doped with Tl suitable for integration with silicon electronics.

Although the solution growth process is explained in detail herein as a preferred method of growing the thallium-doped silicon, it is also possible to use the liquid phase epitaxy process in which after the tin-thallium solvent has added thereto the silicon solute, the solution is cooled, causing the silicon in excess of the solubility limit at the lower temperature to precipitate out as an epitaxial layer. The resulting thallium-doped silicon crystal could be grown on the same silicon source substrate or on a different silicon substrate. This would be of particular interest for growth of thin films.

The embodiments of the invention in which an exclusive property or right is claimed are defined as follows:

1. A method for epitaxially growing a thallium-doped silicon crystal which exhibits an infrared photoconductive response from a metallic solution, comprising the steps of:
    heating and melting a mixture of tin and thallium in an ampoule to thereby provide a liquid metal solvent of tin and thallium;
    providing at a first location in said solvent a silicon source;
    placing at a second location separate from the first location a silicon seed crystal; and,
    providing a temperature gradient in said solution from the silicon source first location in said solution to said second location in said solution with the temperature of the solution at said silicon source first location being hotter than at said second location whereby a thallium-doped silicon crystal grows at said second location.

2. A method for epitaxially growing from a metallic solution a thallium-doped silicon crystal which exhibits an infrared photoconductive response, comprising the steps of:
    providing in an ampoule at an elevated temperature a liquid metal solvent of tin and thallium having a silicon source at a first location in said solution;
    maintaining the solution at a lower temperature at a second location in said ampoule, the second location being remote from the first, whereby silicon dissolves from said silicon source into said liquid metal solvent and precipitates out and epitaxially grows a thallium-doped silicon crystal at said second location.

3. A method for epitaxially growing from a metallic solution a thallium-doped silicon crystal which exhibits an infrared photoconductive response, comprising the steps of:
    providing in an ampoule a liquid metal solvent consisting of tin and thallium, and maintaining one end of the ampoule hotter than the other;
    placing a source of silicon to be dissolved into the hotter end;
    placing a silicon seed crystal into the cooler end;
    dissolving silicon into the tin and thallium solvent from the silicon source at the hotter end; and,
    precipitating out silicon and growing an epitaxial layer of thallium-doped silicon onto said seed crystal at said cooler end.

4. The method according to claim 1, 2 or 3 wherein the temperature of the solution at the location where the crystal grows is 1330° C.

5. The method according to claims 1, 2 or 3 wherein the temperature difference of the solution between the hotter location and the cooler location is about 50° C.

* * * * *